(12) United States Patent
Griffin

(10) Patent No.: US 9,191,016 B2
(45) Date of Patent: Nov. 17, 2015

(54) PHASE COORDINATING SYSTEMS AND METHODS

(71) Applicant: Gain ICs LLC, Peyton, CO (US)

(72) Inventor: Jed Griffin, Falcon, CO (US)

(*) Notice: Subject to any disclaimer, the term of this patent is extended or adjusted under 35 U.S.C. 154(b) by 377 days.

(21) Appl. No.: 13/758,915

(22) Filed: Feb. 4, 2013

(65) Prior Publication Data
US 2014/0218085 A1    Aug. 7, 2014

(51) Int. Cl.
*H03L 7/095*    (2006.01)

(52) U.S. Cl.
CPC .................................... *H03L 7/095* (2013.01)

(58) Field of Classification Search
CPC ....................................................... H03L 7/087
USPC .......................................................... 327/159
See application file for complete search history.

(56) References Cited

U.S. PATENT DOCUMENTS

| | | | |
|---|---|---|---|
| 4,507,661 A | 3/1985 | Hoover, Jr. | |
| 5,185,591 A | 2/1993 | Shuey | |
| 5,423,075 A | 6/1995 | Boese | |
| 5,802,462 A * | 9/1998 | Lautzenhiser | 455/208 |
| 6,777,684 B1 | 8/2004 | Volkov | |
| 7,401,245 B2 | 7/2008 | Fischer et al. | |
| 7,558,317 B2 | 7/2009 | Fischer et al. | |
| 7,721,133 B2 | 5/2010 | Brooks et al. | |
| 7,936,194 B2 | 5/2011 | Griffin | |
| 7,990,224 B2 | 8/2011 | Griffin | |
| 2008/0309377 A1* | 12/2008 | Lee | 327/12 |
| 2009/0105979 A1 | 4/2009 | Valderrama et al. | |
| 2010/0188149 A1 | 7/2010 | Kimmig et al. | |
| 2012/0268397 A1 | 10/2012 | Lee et al. | |

FOREIGN PATENT DOCUMENTS

| | | |
|---|---|---|
| JP | 05-035396 A | 2/1993 |
| JP | 2009-26635 A | 11/2009 |
| JP | 2009266335 | 11/2009 |

OTHER PUBLICATIONS

International Search Report and Written Opinion for Int. Appl. No. PCT/US14/12747, dated May 23, 2014, 10 pp.
Kratyuk, Volodymyr, "Digital Phase-Locked Loops for Multi-GHz Clock Generation", Dec. 12, 2006, 90 pp.
Lee, M.J. Edward, et al., "Jitter Transfer Characteristics of Delay-Locked Loops—Theories and Design Techniques", IEEE Journal of Solid-State Circuits, vol. 38, No. 4, Apr. 2003, 8 pp.
"International Preliminary Report on Patentability and Written Opinion of the International Searching Authority," issued in corresponding case PCT/US2014/012747 issued on Aug. 4, 2015.
Office Action issued in co-owned U.S. Appl. No. 14/514,286.

* cited by examiner

*Primary Examiner* — Daniel Puentes
(74) *Attorney, Agent, or Firm* — Trenner Law Firm, LLC; Mark D. Trenner

(57) ABSTRACT

Fast phase coordinating systems and methods are disclosed. An example system includes a phase locator configured to detect a first phase of a reference signal and a first phase of a coordinating signal after the first phase of the reference signal. An integrator is configured to integrate from the first phase of the reference signal to a location phase of the coordinating signal and integrate oppositely from the first phase of the coordinating signal to a time-shifted phase of the reference signal and output the result. A control function is configured to shift the phase of the coordinating signal in response to output from the integrator.

16 Claims, 15 Drawing Sheets

PHASE COORDINATING SYSTEMS AND METHODS

BACKGROUND

Phase locked loops (or PLLs) traditionally have been used to attempt to lock (albeit poorly) a phase of a signal to a reference phase of a reference signal by control feedback to a controllable oscillator providing the signal. However, this attempt to lock is severely hampered by jitter amplification or jitter peaking, forcing traditional PLLs to a compromised locking to an average of phases over many multiple cycles via large loop filtering. The respective location of the signal phase relative to a reference phase is established by a phase detector which outputs a signal used to shift the frequency and hence the phase of the oscillator. Phase locked loops have application in board-level communication, wireless communication (including FM demodulation), clocking schemes, and frequency synthesis in industries including radio, telecommunications, and computers, to name only a few examples.

Historically, phase detectors have been used to detect the relative locations of signal phases to reference phases from reference signals. All phase detecting methods used previously have relied on once-a-cycle sampling (discrete-time control systems) to determine whether the signal phase precedes or follows the reference phase, and then amplifying that difference via the loop to shift the signal phase in the direction of the reference phase. Due to inherent jitter peaking, amplifying the detected difference to shift the signal phase too far past the reference phase to where the loop becomes unstable, amplification thus has to be greatly reduced via loop filtering. This severely limits accuracy and leads to a low bandwidth compromise. All traditional PLLs have grappled with jitter peaking and have had to settle for far from ideal performance due to this limitation.

DETAILED DESCRIPTION

Phase detectors may employ a charge pump which detects no phase error when the respective phases of the reference and coordinating are close enough to be within a dead band of the detector. These errors cause traditional phase detectors to be far from ideal, especially due to the even more pronounced jitter peaking discussed previously, which typically forces the phase detectors into an undesirable, low coordinating bandwidth.

The phase coordinating systems and methods described herein may be implemented in a phase locked loop (PLL) that locks a coordinating phase at a constant distance from a reference phase regardless of reference variation, and rate of variation; this is also accomplished while increasing the loop gain and eliminating jitter peaking. Thus, such phase coordinating systems and methods can approach or even achieve ideal phase coordinating, or wider coordinating bandwidth. The term "coordinating bandwidth" is used herein to mean a measure of phase coordinating which examines at what frequency of shifting do shifts in the reference phase cease to be the same frequency and amplitude as the coordinating phase. Accordingly, jitter peaking can be reduced or altogether eliminated to achieve much more ideal phase coordinating through control system design, e.g., using continuous-time control loop instead of the discrete-time loops of traditional phase coordinating. The systems and methods may be implemented for higher coordinating bandwidth applications, with less jitter in clocking applications and more accurate windowing and more reliable and faster data transfer in communications applications.

Before continuing, it is noted that as used herein, the terms "includes" and "including" mean, but is not limited to, "includes" or "including" and "includes at least" or "including at least." The term "based on" means "based on" and "based at least in part on." It is also noted that specific reference to "low" and "high" signals is used for purposes of illustration, and may be used interchangably in other examples.

It is also noted that the terms "coordinate" and "coordinating" as used to describe "phase" coordinating are used herein to mean a type of processing signal phases, wherein ideal following or locking of signal phases means "replicating" or "identical/matching" signal phases. This type of fast signal processing is something that no one has achieved before for "phase transfer" wherein "transfer" is a known engineering term when used in the context of electronic signals and signal phases. It is noted, however, that the term "phase coordinating" as used herein is new to engineering circles, and is used to more clearly distinguish the fast signal processing described herein, which is completely different than anything current connotations imply.

Figure 1:
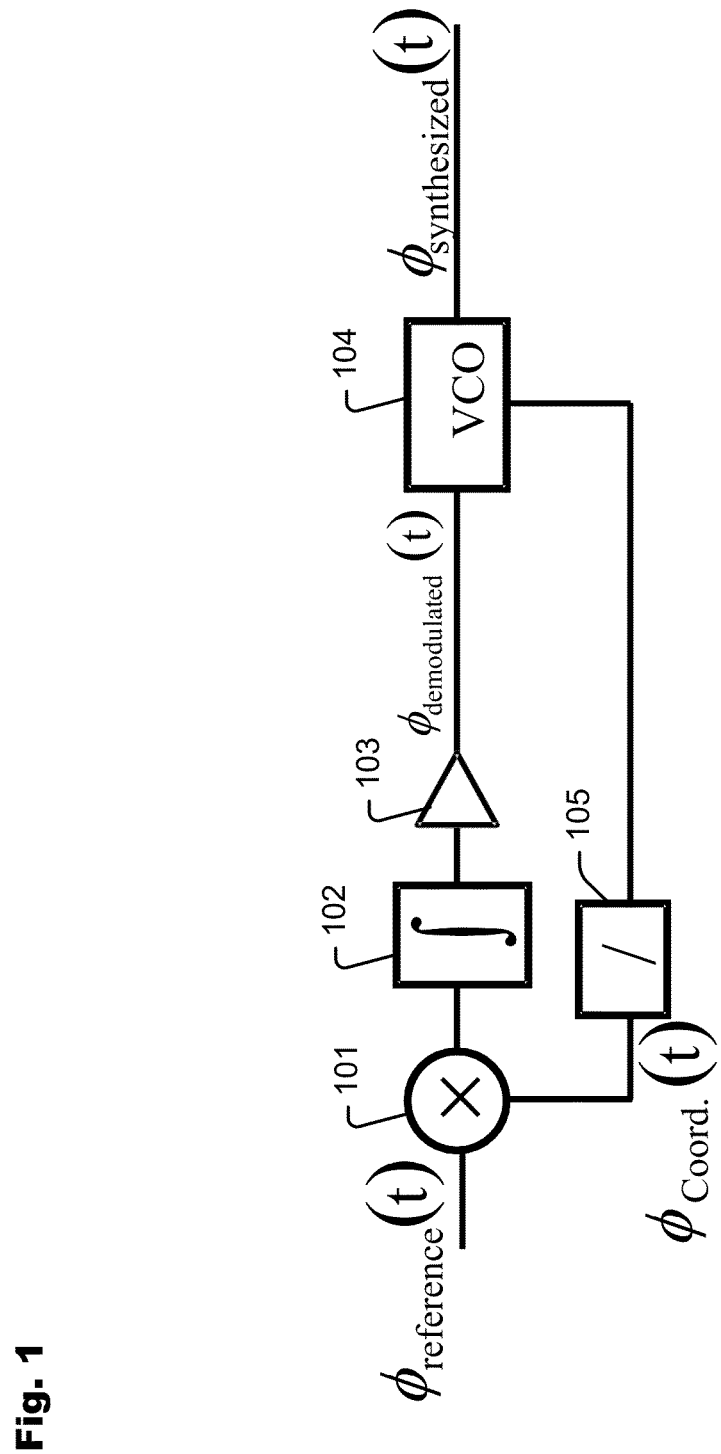
FIG. 1 is a block diagram of an example fast phase coordinating system.

FIG. 1 is a block diagram of an example fast phase coordinating system. A phase locator 101 is configured to detect a first coordinating phase of a coordinating signal following first reference phase of a reference signal, and to repeat this for each subsequent first reference phase occurring thereafter on the reference signal. The first coordinating phase and first reference phase can correspond to either the rising or falling edge of the clock.

A higher frequency coordinating signal may have multiple (if not many) coordinating phases occurring after the first reference phase and before the last or time-shifted reference phase. As such, the phase locator detects the first coordinating phase (located phase) as occurring after the first reference phase. When the detected phase is closer to the first reference phase and further from the last or time-shifted reference phase, it denotes too high of a frequency on the coordinating signal relative to the reference frequency.

A lower frequency coordinating signal may have a delayed coordinating phase (if one ever occurs) after the first reference phase. As such, the phase locator detects the first coordinating phase (location phase) much further from the first reference phase and closer to the last or time-shifted reference phase. When the detected phase occurs further from the first reference phase and closer to the last reference phase, it denotes too low of a frequency on the coordinating signal relative to the reference frequency.

A coordinating frequency that converges to the reference frequency may be denoted by a first coordinating phase on the coordinating signal that is balanced between the first phase of the reference signal and the last phase of the reference signal, such that any small error to either side quickly diminishes with high loop gain, by coordinating continuous-time between the first and the last phase of the reference signal. The more stable phase coordinating of continuous-time (e.g., compared to the unstable phase coordinating of traditional discrete-time phase detection) are also denoted in the mathematical models and graphs described herein.

In an example, an integrator 102 may be configured to negatively integrate from the first reference phase of the reference signal to the located phase of the coordinating phase, and to positively integrate from the located phase of the coordinating signal to the last or time-shifted reference phase of the reference signal.

An amplifier 103 may or may not be configured to amplify the control signal, integrated output from the integrator, into the controlled oscillator 104. A controlled oscillator (voltage-controlled oscillator) 104 varies phase and frequency output of the coordinating signal according to control signal input so as to shift the coordinating phase into phase lock relative to the reference phase. Coordinating signal divider 105 scales the coordinating signal input to phase locator 101 to cause the synthesized signal to be a phase or frequency multiple of the coordinating signal phase locked to the reference signal.

Figure 2:
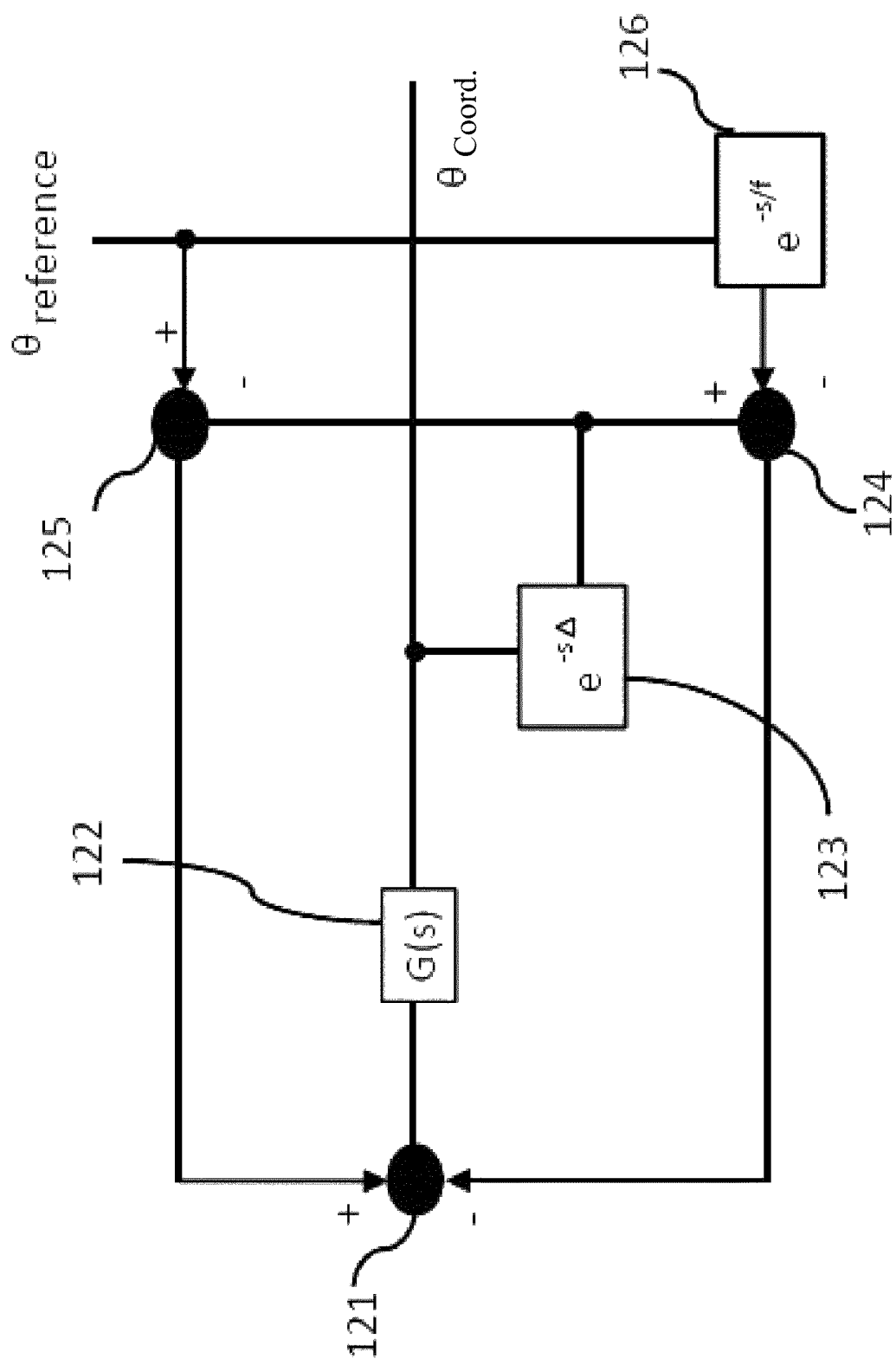
FIG. 2 is a block diagram of an example control loop of the fast phase coordinating system.

FIG. 2 is a Laplace block diagram of an example control loop of the fast phase coordinating system. In this illustration, a control function 122 may be configured to shift a coordinating phase via the integrator and controlled oscillator.

Positive output from the control function 122 causes the coordinating phase to shift more towards the first reference phase. Negative output from the control function 122 causes the phase to shift more towards the last or time-shifted reference phase. Beginning at summing intersection 121, coordinating and reference phases represented, respectively, by θ-coordinating and θ-reference, are combined such that θ-coordinating is subtracted from θ-reference and divided by 2, assuming that the first and last reference phases are equal, otherwise the subsequent modeling holds for input to control function 122.

During operation, the control function 122 outputs an updated coordinating phase. The coordinating phase may be time-shifted according to the relation $e^{-s\Delta}$ at 123, due to delay through frequency divider, while the first reference phase is time-shifted according to the relation $e^{-s/f}$ at 126 identifying the last or time-shifted reference phase. Time-shifted reference and time-shifted coordinating may be combined at node 124 such that the time-shifted reference signal is subtracted from time-shifted coordinating signal. The result is sent to the negative node of 121.

A first reference phase is combined with time-shifted coordinating phase at node 125 such that time shifted coordinating phase is subtracted from the first reference phase. The result is sent to the positive node of 121 where the result from the difference of the time shifted coordinating phase and time-shifted reference phase is subtracted from the difference of the first reference and time-shifted coordinating phases for input to control function 122.

An example control equation for the control loop depicted in FIG. 2 may be represented mathematically by the following expression:

$$G(s) * [(\theta_{reference} - e^{-s\Delta}\theta_{tracking}) - (e^{-s\Delta}\theta_{tracking} - e^{-s/f}\theta_{reference})]$$

Thus:

$$\theta_{tracking} = \frac{1}{2e^{-s\Delta}}((1 + e^{-s/f})\theta_{reference}$$

When $G = \frac{\alpha}{s + \omega_p}$, $$\theta_{tracking} = \frac{1}{e^{-s\Delta} + \frac{s + \omega_p}{2\alpha}}\left(\frac{(1 + e^{\frac{-s}{f}})\theta_{reference}}{2}\right)$$

It can be seen by the above expressions that as loop gain α approaches ∞, or becomes very large (a desirable outcome for more accurate phase coordinating), and Δ approaches zero and f approaches ∞, the derivatives of θ-coordinating and θ-reference approach one another, or become equal.

Figure 3:
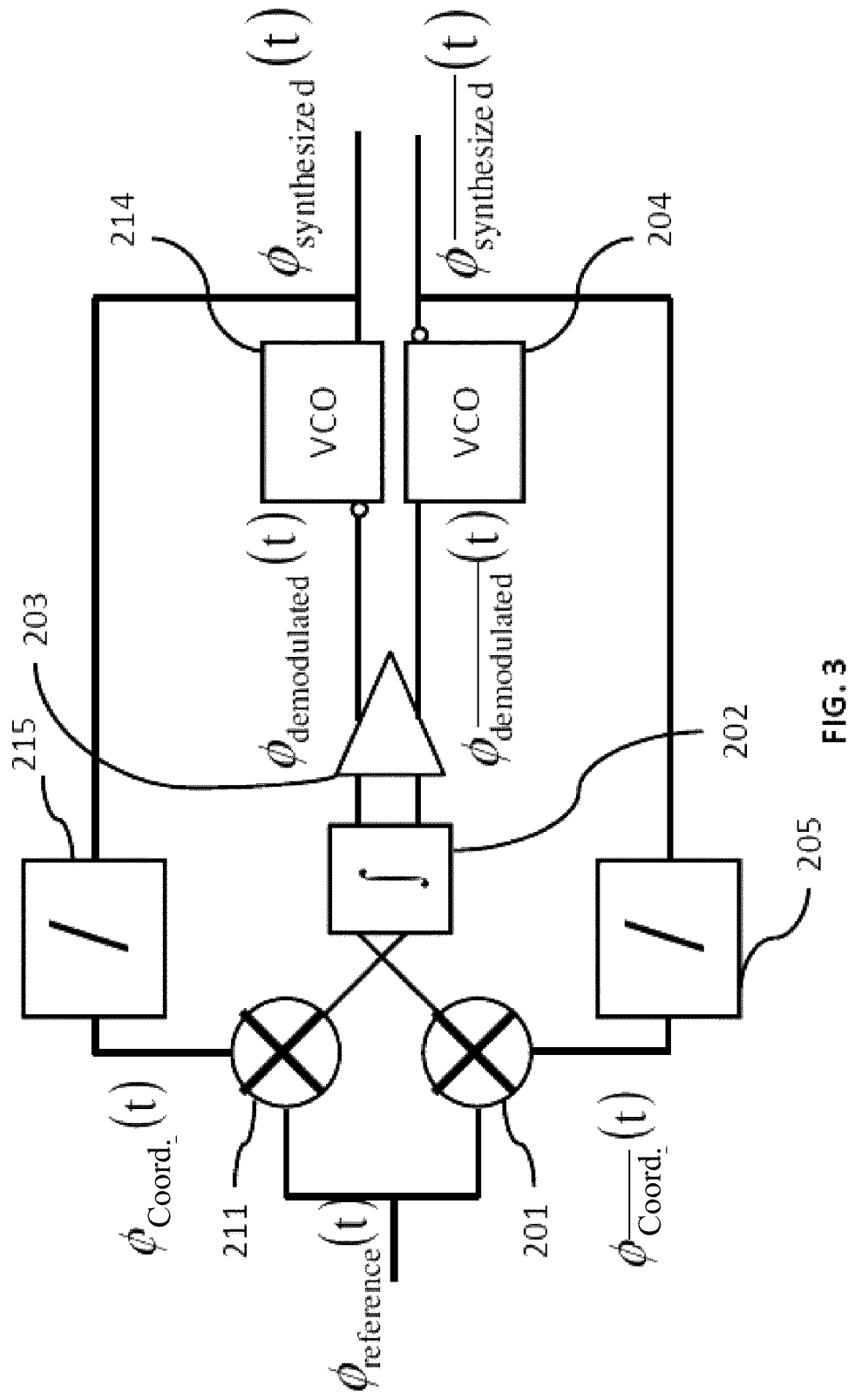
FIG. 3 is a block diagram of another example fast phase coordinating system.

FIG. 3 is a block diagram of another example fast phase coordinating system. In this example, a differential time-domain embodiment is depicted which includes phase locators 201 and 211, differential integrator 202, differential amplifier 203 and separate voltage controlled oscillators 204 and 214. Improved resistance to electromagnetic noise may be enabled by use of two phase locators to allow for comparison of coordinating and synthesized signals to coordinating and synthesized complements. Separate coordinating signal dividers 205, 215 may be used for separate scaling of both the coordinating signal and the coordinating signal complement.

Before continuing, it is noted that the fast phase coordinating system illustrated by way of example in FIGS. 1-3, may not include a loop filter (apart from integration for continuous-time sampling) and/or charge pumps. Accordingly, explicit amplification may be provided in the loop for greater accuracy, high coordinating bandwidth, low-jitter peaking, and may enable continuous-time operation.

Figure 4:
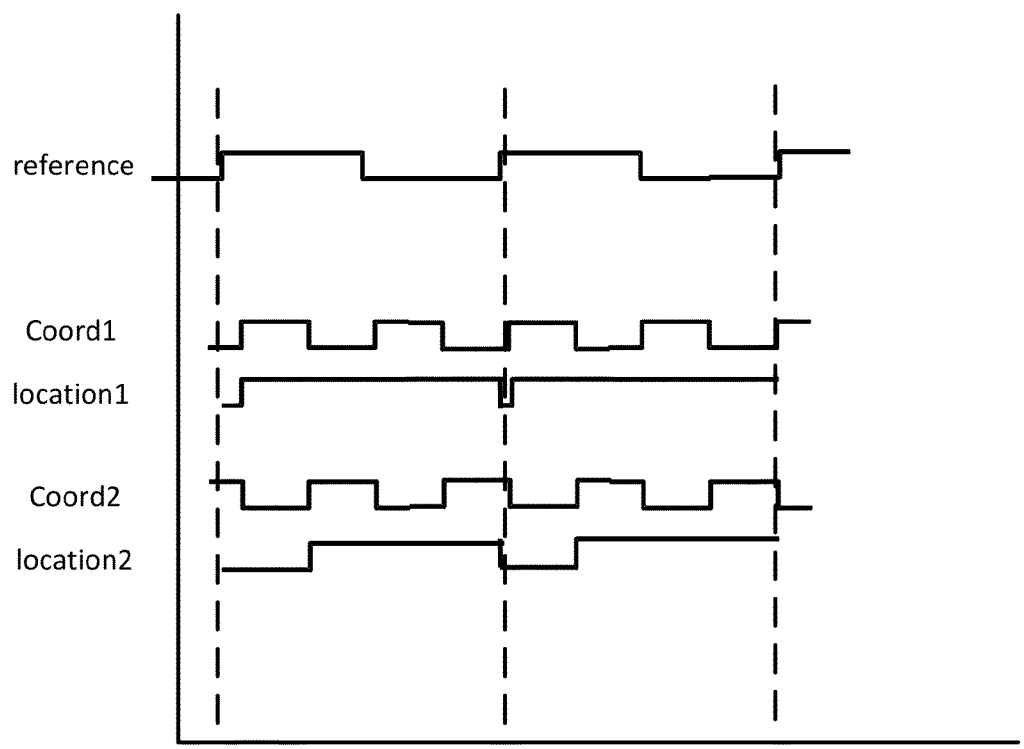
FIG. 4 is a graph illustrating waveforms according to example phase coordinating scenarios in which a coordinating phase is closer to a first reference phase or further from a first reference phase.

FIG. 4 is a graph illustrating waveforms according to example phase coordinating scenarios in which a location phase is closer to the first reference phase (the coordinating frequency is much faster than the reference frequency). In FIG. 4, the waveform designated "Ref" represents a reference signal input to a phase locator as described above. The waveforms "Coord1" and "Coord2" represent coordinating input to the phase locator described above. The waveform designated "Loc1" and "Loc2" represent location signals output from a phase locator described above.

Phase location begins when the Ref waveform has transitioned to a high state as shown. The Coord1 waveform is also in a low state. Initially, phase locator 101 outputs a low location signal, as indicated by waveform Loc1. Shortly after the waveform Coord1 transitions to a high state and causes the transition of waveform Loc1 to a high output.

While the waveform Coord1 transitions to low and high again in the same period, waveform Loc1 remains in a high state. At the end of the first reference period, when waveform Ref transitions back to high, waveform Loc1 output transitions back to low. The waveform Loc1 continues in a low state until waveform Coord1 transitions high again (and may even continue in a low state if Coord1 does not transition).

In another example illustrated by FIG. 4, waveform Coord2 is seen having a location phase closer to the first reference phase. Phase location begins when waveform Ref has transitioned to a high state. Waveform Coord2 is also seen in a high state. Therefore, phase locator 101 outputs a low location signal, as seen by waveform Loc2. While the phase locator is outputting a low signal (see waveform Loc2), the waveform Coord2 is seen transitioning to a low state. This does not change the low state of waveform Loc2 output, because waveform Coord2 has not transitioned to a high state. The waveform Coord2 transitions to high and causes the transition of waveform Loc2 to a high output.

At the conclusion of the first reference period, when waveform Ref is seen transitioning back to high, waveform Loc2 transitions back to low. A low waveform Loc2 output continues until waveform Coord2 transitions high again before the end of the second period of waveform Ref.

Figure 5:
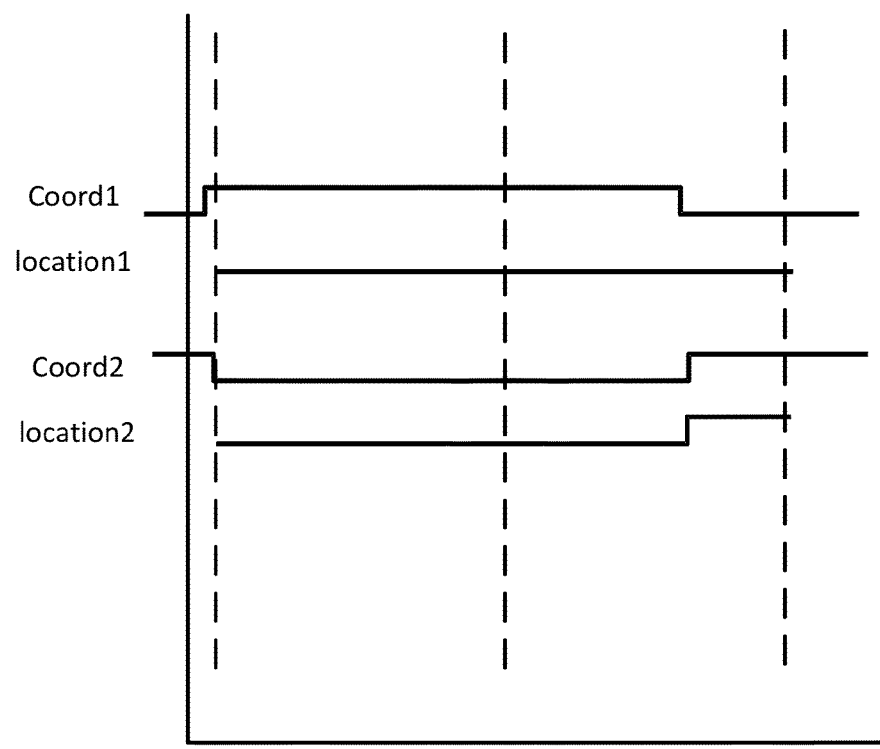
FIG. 5 is a graph illustrating waveforms according to example phase coordinating scenarios in which a coordinating phase is longer than a reference phase.

FIG. 5 is a graph illustrating waveforms according to example phase coordinating scenarios in which a location phase is closer to the last or time shifted reference phase (e.g., the furthest from the first reference phase, denoting lower coordinating frequency than reference frequency). In this illustration, the waveform Ref represents a reference signal input to a phase locator in accordance with embodiments of the disclosure. Waveform Coord1 and waveform Coord2 represent coordinating input to the phase locator described above. Waveform Loc1 and waveform Loc2 represent location signals output from the phase locator described above.

As with the examples described above with reference to FIG. 4, phase location begins when waveform Ref has transitioned to a high state. The waveform Coord1 is also in a high state. Therefore, phase locator 101 outputs a low location signal, as seen by waveform Loc1. While phase locator is outputting a low waveform Loc1, the waveform Ref transitions to a low state. This does not change the low output seen by waveform Loc1, because waveform Coord1 has not had a first transition to a high state. In the example depicted in the plot shown in FIG. 5, the waveform Ref transitions to low, high again and low once more over approximately a 1.5 period, while waveform Coord1 remains in a high state.

It can be seen that in the example depicted in FIG. 5, waveform Loc 1 does not transition to a high output state because the waveform Coord1 does not transition back to high.

In another example illustrated by FIG. 5, waveform Coord2 has a phase similar to that of waveform Coord1. Phase location begins when waveform Ref has transitioned to a high state. The waveform Coord2 is in a low state. Phase locator 101 outputs a low location signal, as seen by waveform Loc2. While phase locator is outputting a low waveform Loc2, the waveform Ref transitions to a low state. This does not change the low waveform Loc2 output because waveform Coord2 has not transitioned to a high state. In the example shown by the plot in FIG. 5, waveform Ref transitions to low and high again once more, while waveform Coord2 remains in a low state.

When waveform Coord2 transitions to a high state in the second period of waveform Ref, the phase locator 101 outputs a high signal as can be seen by waveform Loc2. When waveform Ref transitions back to high, waveform Loc2 transitions back to low until waveform Coord2 transitions low again and then back to high again.

Figure 6:
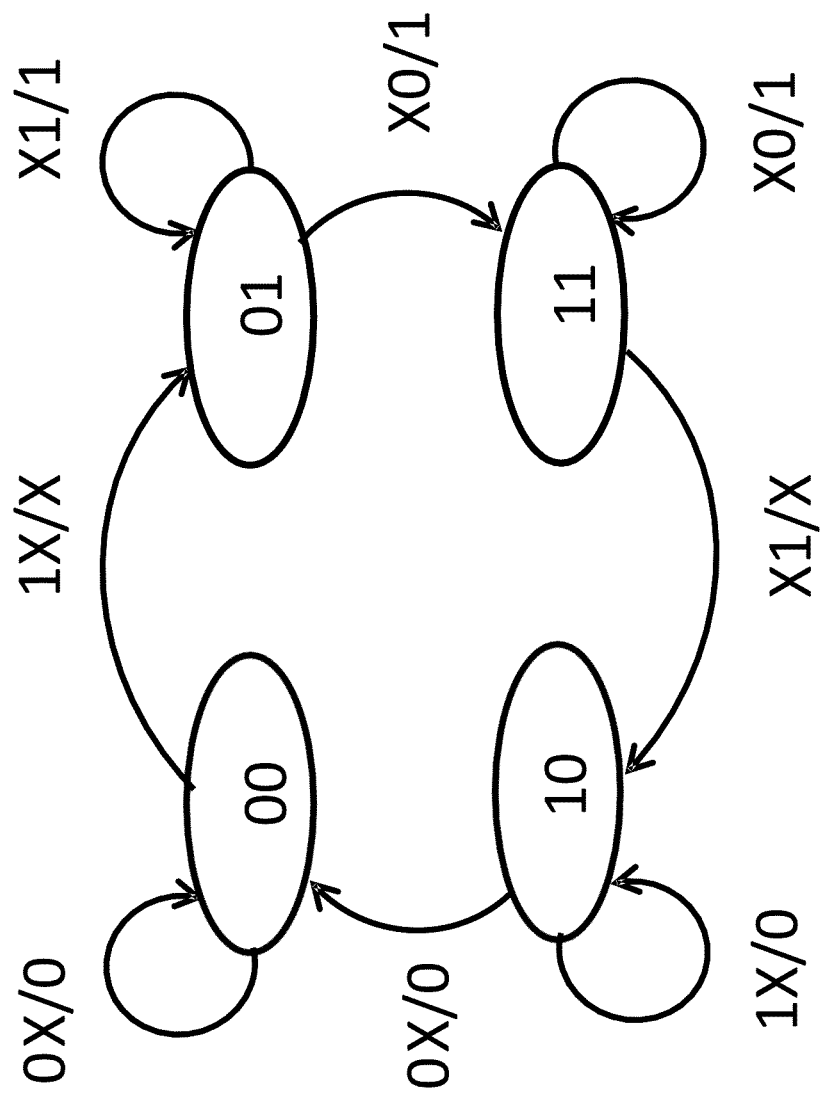
FIG. 6 is a state diagram illustrating phase locating by an example fast phase coordinating system.

FIG. 6 is a state diagram illustrating phase locating by an example fast phase coordinating system. In the example illustrated by FIG. 6, actions are described by the nomenclature "Ref Coord/Loc," as introduced above for the examples shown in FIG. 4 and FIG. 5. For example, the nomenclature 0X/0 shown in FIG. 6 refers to Ref=0, Coord=X, and Loc=0; and the nomenclature 1X/1 refers to Ref=1, Coord=X, and Loc=1. The numbers 1 and 0 represent the state of the reference signal input (Ref), the state of the coordinating signal input (Coord), and the state of the location signal output (Loc), respectively. An 'X' in place of one of a 1 or 0 indicates that the state can be 1 or 0 and that the action takes place regardless of the state of that signal. For example, 1X/X describes an action in which the reference signal is in a high state while the coordinating and location signals are in unknown states which may not have impact on the state of a phase locator.

In the example illustrated in FIG. 6, the phase locator is shown as it may experience four different states while locating a coordinating signal phase with respect to a reference signal phase.

In a first example state (0 1), a reference signal has transitioned to a high state to begin phase location. With the reference high, phase locator 101 outputs a low location signal. While coordinating signal remains high, phase locator 101 remains in state (0 1) outputting a low location signal regardless of the behavior of the reference signal. For example, if the last or time-shifted phase of the reference signal occurs before the first phase of the coordinating signal, transition of the reference signal to a low state while phase locator 101 is in the first state does not change the phase locator state or location output. When the coordinating signal transitions to low, the phase locator transitions to a second state (1 1).

In a second example state (1 1), phase locator 101 continues to output the low location signal as in the first state. In this state, while the coordinating signal remains low, phase locator 101 maintains the second state outputting a low location signal regardless of the behavior of reference signal. For example, if the last or time-shifted phase of the reference signal occurs before the first phase of the coordinating signal, transition of the reference signal to a high state while phase locator 101 is in the second state will not change the phase locator state or location output. When the coordinating signal transitions again, to high this time, the phase locator transitions to a third state (1 0).

After transitioning into the third example state (1 0), the phase locator 101 outputs a high location signal. Phase locator 101 remains in the third state, outputting a high location signal while the reference signal is in a high state regardless of the behavior of the coordinating signal. When the reference signal transitions again, this time to low, phase locator 101 continues to output a high location signal but transitions into fourth state (0 0).

In the fourth example state (0 0), the phase locator 101 outputs the high location signal as in the third state. But in the fourth state, while reference signal remains low, the phase locator 101 outputs a high location signal regardless of the behavior of the coordinating signal. When the reference signal transitions high again, phase locator transitions back to the first state where phase location begins to locate subsequent phases of coordinating relative to reference phases. As above, location output in the first state is low.

While the process of phase location has been described as starting at first state (0 1), proceeding through the other three states (1 1), (1 0), and (0 0), and then returning to the first state (0 1), the system of reference and coordinating may have such relative values of phase and frequency that phase location may begin and proceed through any state, such as starting in state (0 0) and then proceeding through states (0 1), (1 1), and (1 0).

Figure 7A:
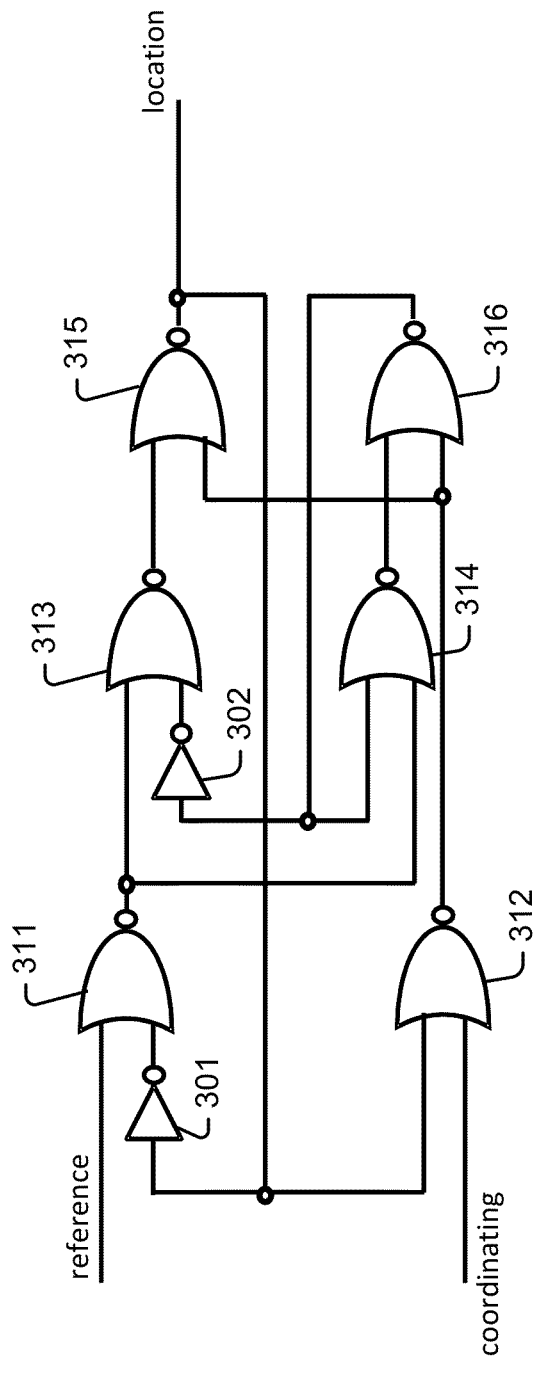
FIG. 7(a)-(e) are logic diagrams of an example phase locator.

FIG. 7(a) is a logic diagram of an example phase locator. As described above, the phase locator is configured to relatively locate reference and coordinating signal phases. Output from the phase locator represents the relative location of the coordinating phases with varying high and low states.

As depicted in FIG. 7(a), a reference signal is input to a NOR gate 311 and combined with a feedback signal which has been inverted by inverter 301. Output from NOR gate 311 is received by one input of NOR gate 313 as well as one input of NOR gate 314. At NOR gate 313, output from NOR gate 311 is combined with inverted signal output from NOR gate 316 while at NOR gate 314, output from NOR gate 311 is combined with signal output from NOR gate 316.

Output from NOR gate 313 is input to NOR gate 315 which combines this output with output from NOR gate 312 and outputs final output as a location signal.

While NOR gate 311 receives feedback signal input, NOR gate 312 receives a feedback signal input and combines the coordinating signal with output from NOR gate 315. The result is output to NOR gate 316 where it is combined with output from NOR gate 314. Output from NOR gate 316, is sent back as a feedback signal to NOR gate 314.

While the examples shown in FIG. 7(a) generally avoids component redundancy, other configurations of NOR gates and inverters may yield a phase locator having the functions presently disclosed and, in some cases, additional functions.

Figure 7B:
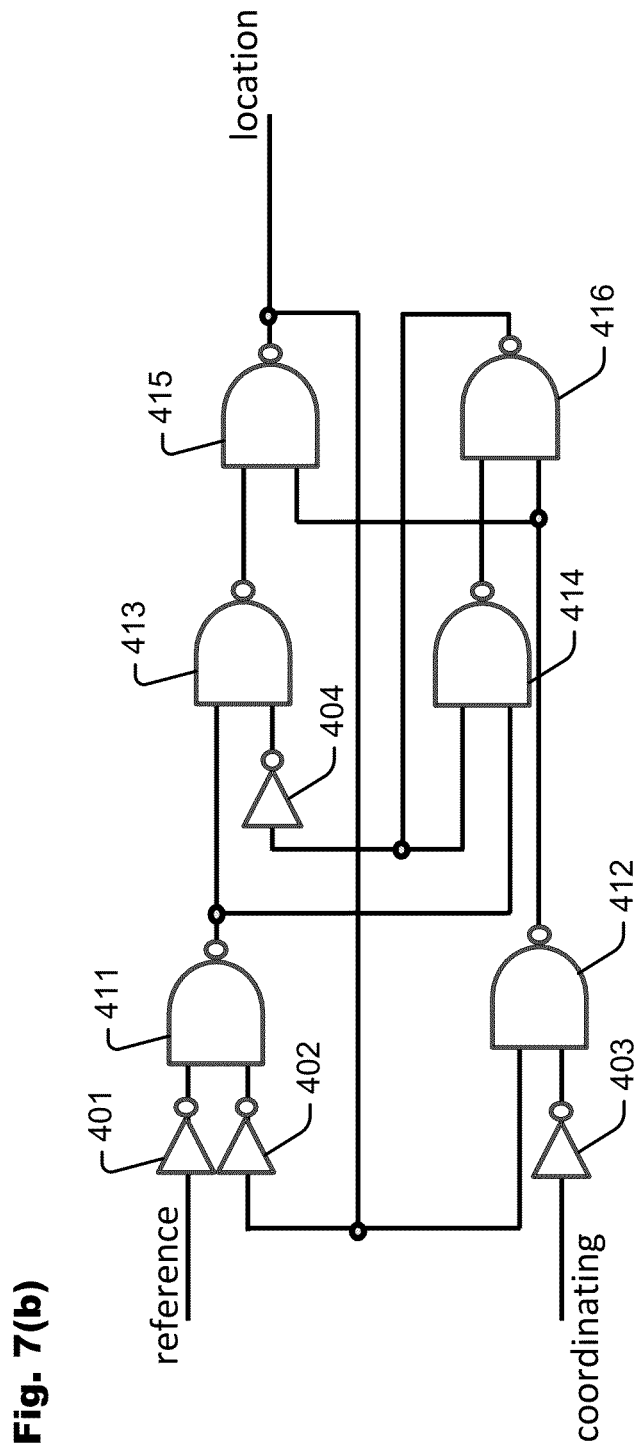

FIG. 7(b) is a logic diagram of another example phase locator. Again, the phase locator may be configured to relatively locate reference and coordinating signal phases. Output from the phase locator represents the relative location of the coordinating phases with varying high and low states.

As depicted in FIG. 7(b), a reference signal is inverted by inverter 401 and combined with a time-shifted feedback signal which has been inverted by inverter 402 at NAND gate 411. The combination is output from NAND gate 411 to one input of NAND gate 413 and one input of NAND gate 414. At NAND gate 413, output from NAND gate 411 is combined with an inverted signal from NAND gate 416 and the result is output to NAND gate 415 while at NAND gate 414, output from NAND gate 411 is combined with a signal from NAND gate 416 and output to NAND gate 416.

Output from NAND gate 415 is input to inverter 402 for combination with a reference signal in NAND gage 411 and to final output as a location signal.

While NAND gate 411 receives reference signal input, NAND gate 412 receives a coordinating signal input inverted by inverter 403 and a input from NAND gate 415 and combines the two into output which is sent to one input of NAND gate 416 and one input of NAND gate 415. NAND gate 416 combines output from NAND gate 412 with output from NAND gate 414 to provide output to inverter 404 and NAND gate 414.

While the example shown in FIG. 7(b) generally avoids component redundancy, other configurations of NAND gates and inverters may yield a phase locator having the functions presently disclosed and, in some cases, additional functions.

It should be noted that the examples described above are provided for purposes of illustration, and are not intended to be limiting. Other devices and/or device configurations may be utilized to carry out the operations described herein. It should be noted that the phase locator described above locates a first phase on the coordinating signal that is either a positive edge or a negative edge of the coordinating signal, but not both in this illustration. By in fact creating a state machine that locates the first phase on the coordinating signal whether it be positive edge or negative edge, frequency aliasing (locking to a harmonic of the reference frequency), and a common problem with PLLs, can be eliminated. Both types of phase locators and can be implemented via state machines similar to the one described herein or flip flops such as the examples shown in FIG. 7(c)-(e).

Figure 7C:
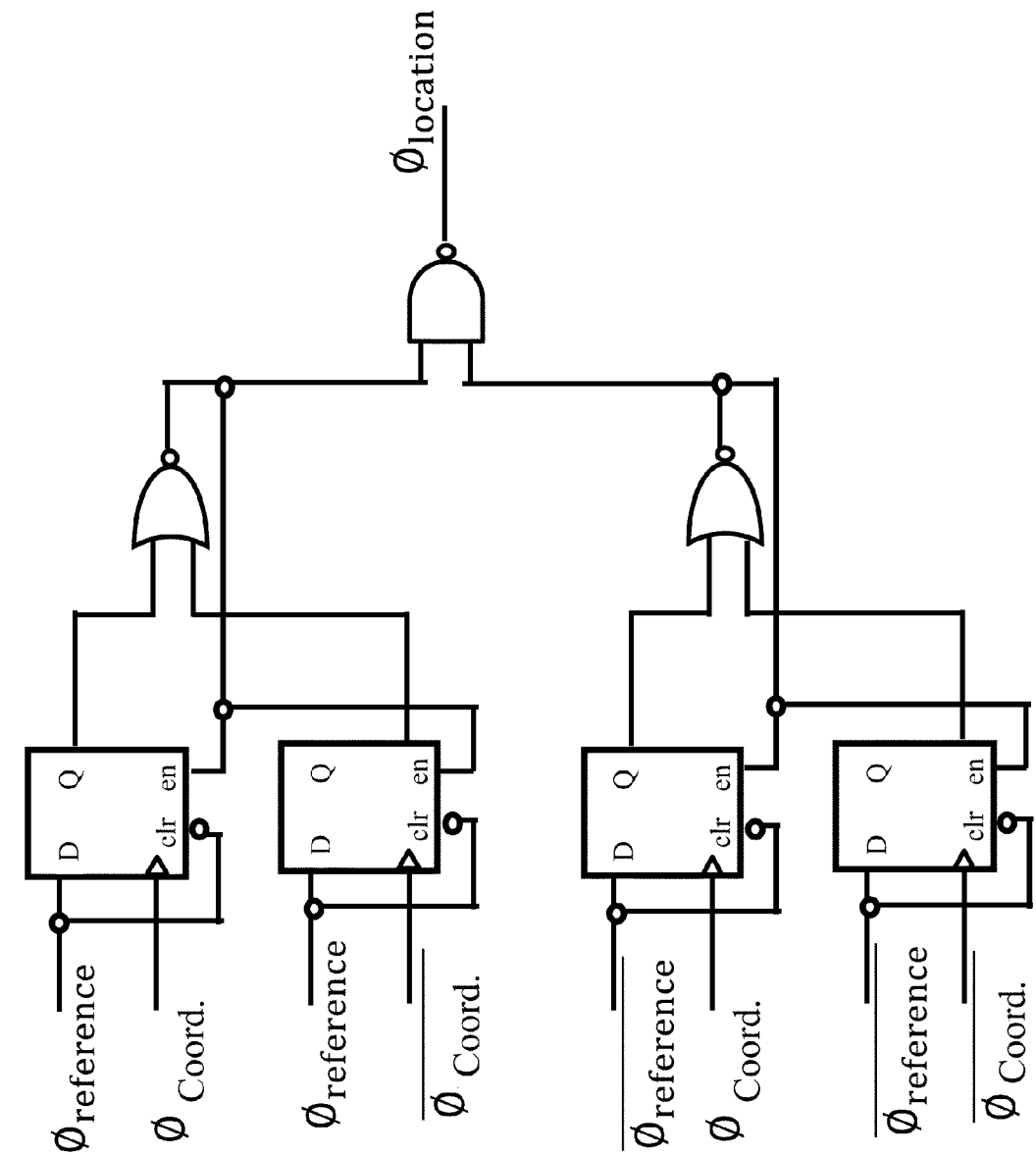
Figure 7D:
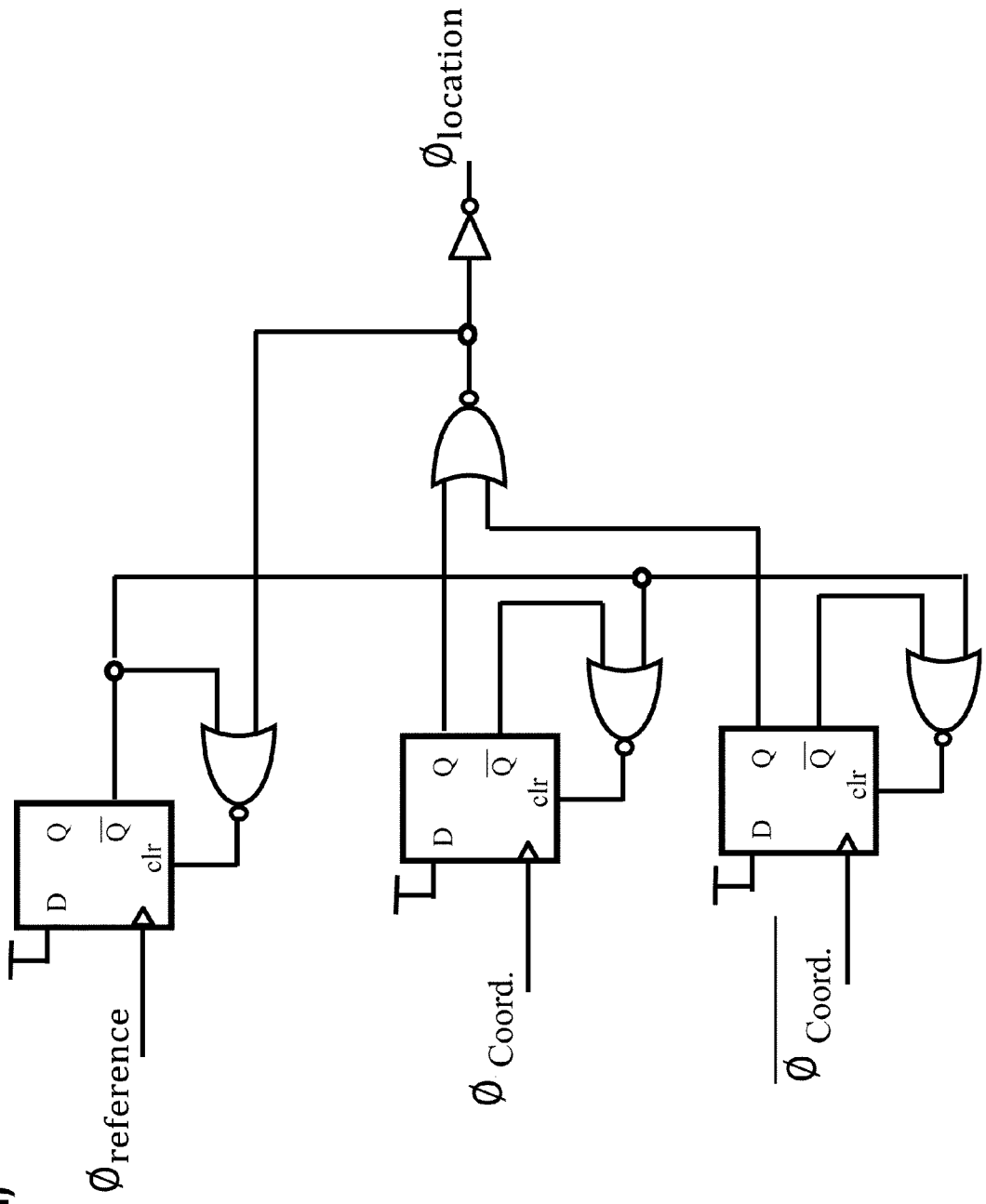
Figure 7E:
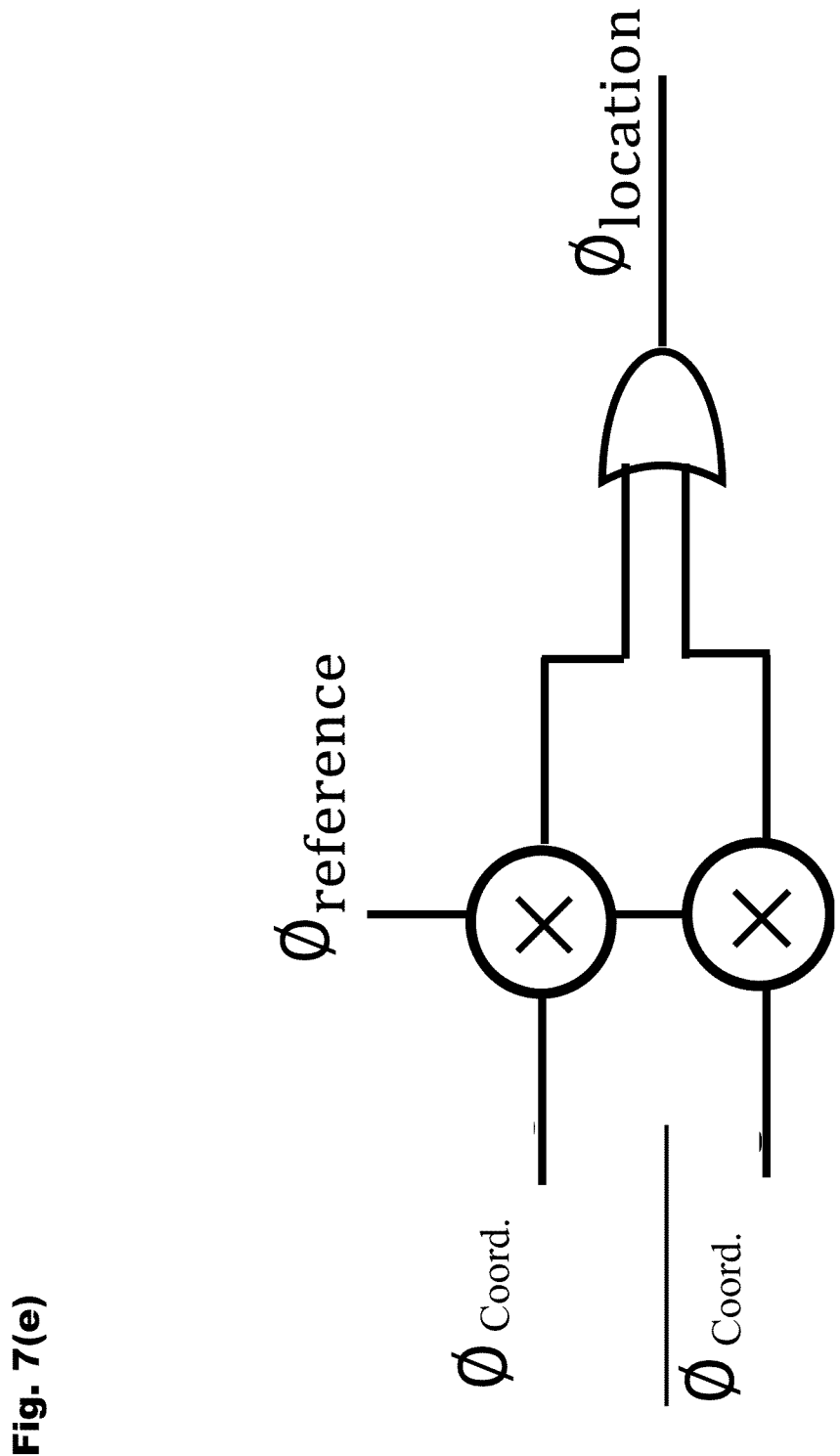

FIG. 7(c)-(e) are example logic diagram of an example phase locator, locating the first phase of the coordinating signal regardless of whether it is positive or negative edge of the coordinating signal (or an antialiasing locator). These implementations may be used to achieve high speed (e.g., on the order of GHz) with antialiasing using the state machine phase locators described herein.

Figure 8:
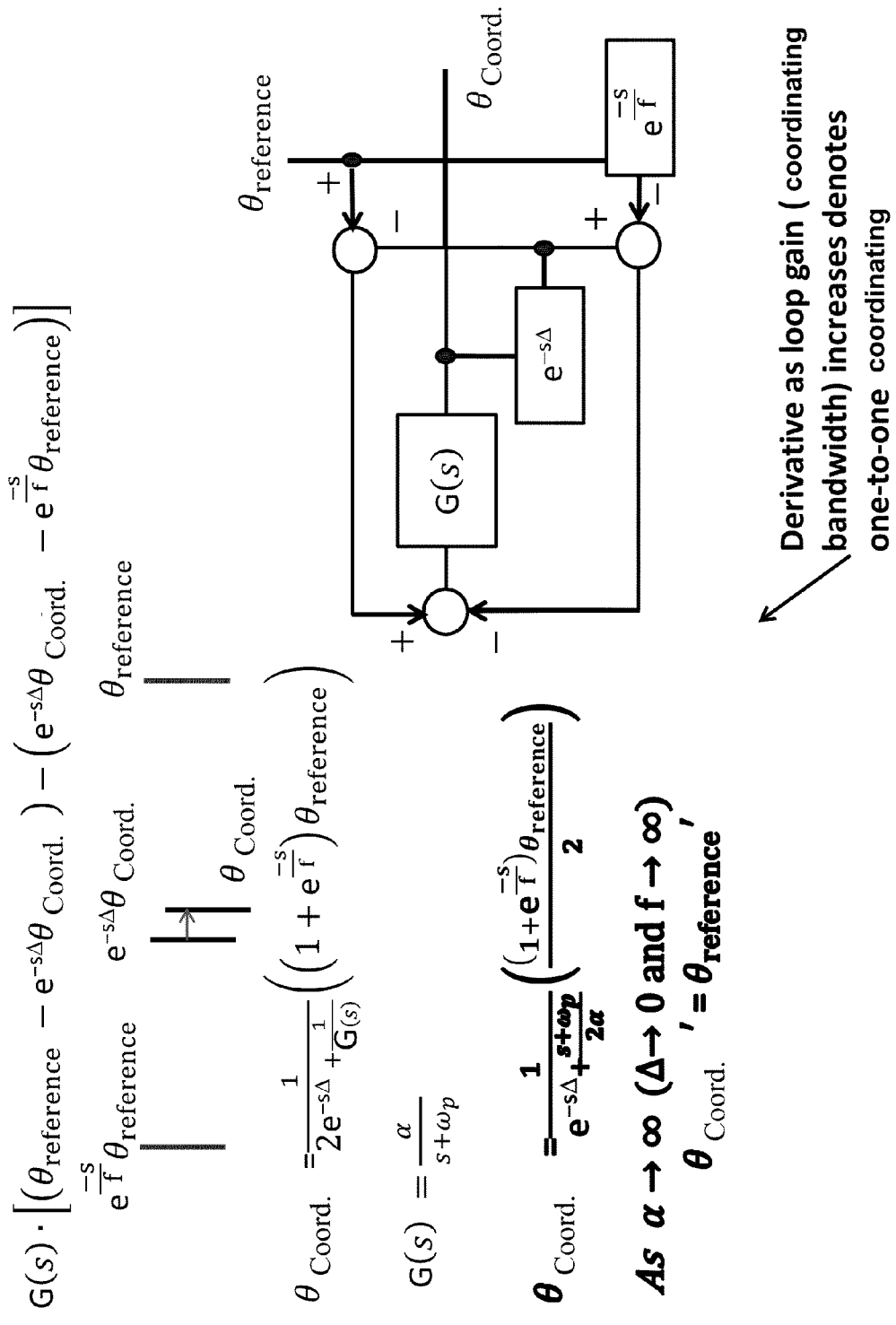
FIG. 8 is a phase line plot for fast phase coordinating.

FIG. 8 is a phase line plot illustrates the first reference phase as described above and the last or time shifted reference phase relative to the first coordinating phase identified by the phase locator (location phase) and the corresponding shift in the location phase when amplified by the loop gain in the direction that would balance the location phase between both reference phases. The math is derived from both the phase line plot and Laplace block diagram demonstrating the fast phase coordinating achievable. All phases involved and the loop gain are shown. Still other examples are also contemplated as being within the scope of the claims, as will be readily understood by one having ordinary skill in the art after becoming familiar with the teachings herein.

Figure 9A:
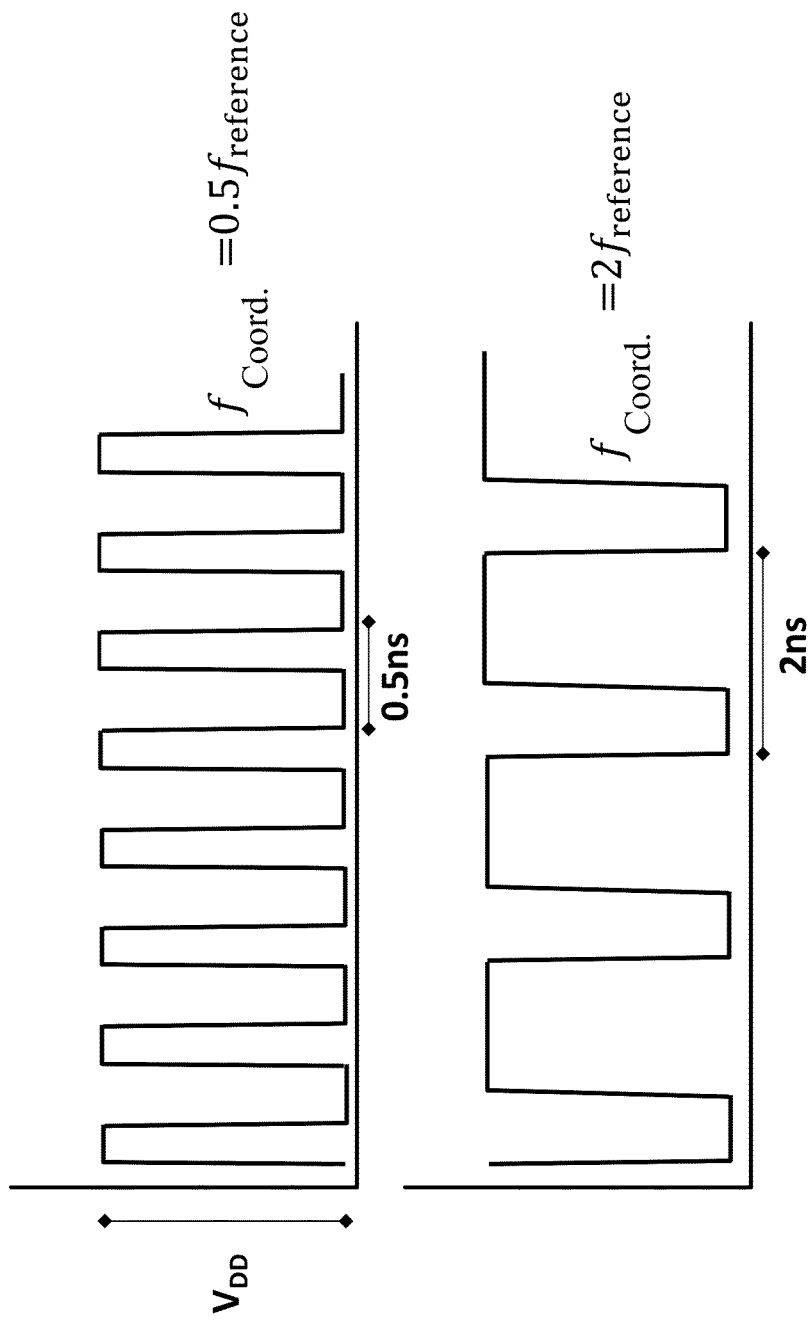
FIG. 9(a)-(c) show example output data of an actual phase coordinating system.
Figure 9B:
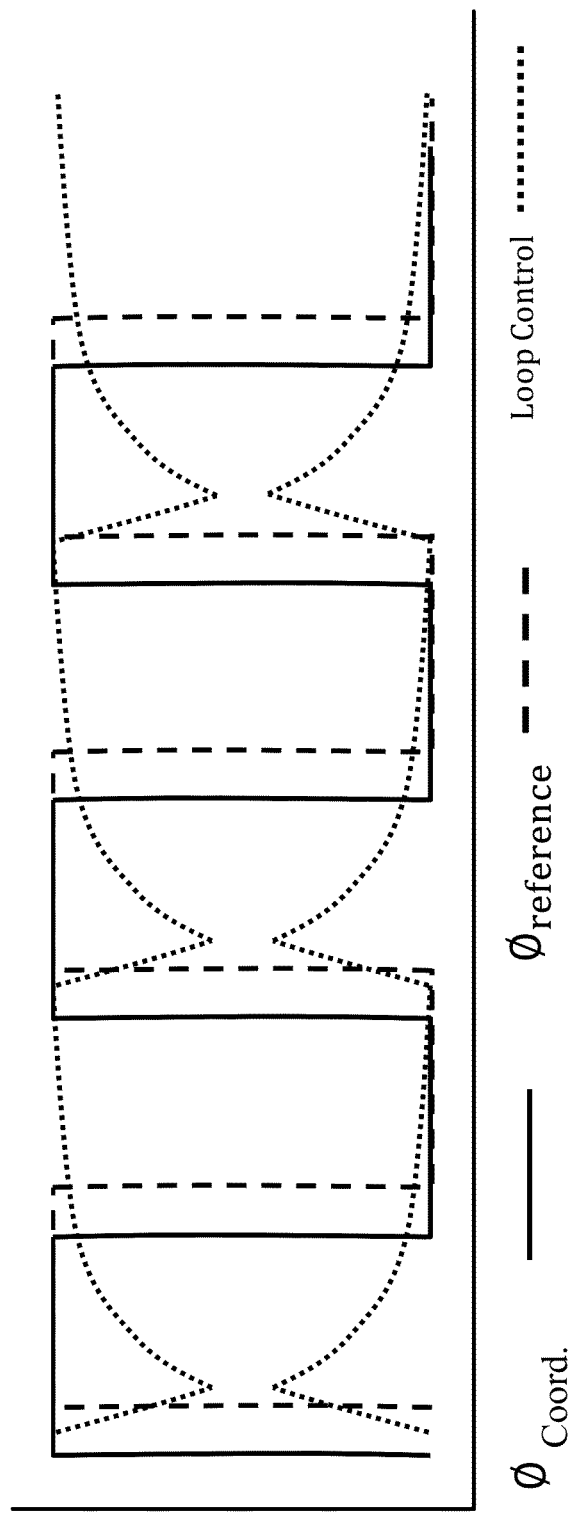
Figure 9C:
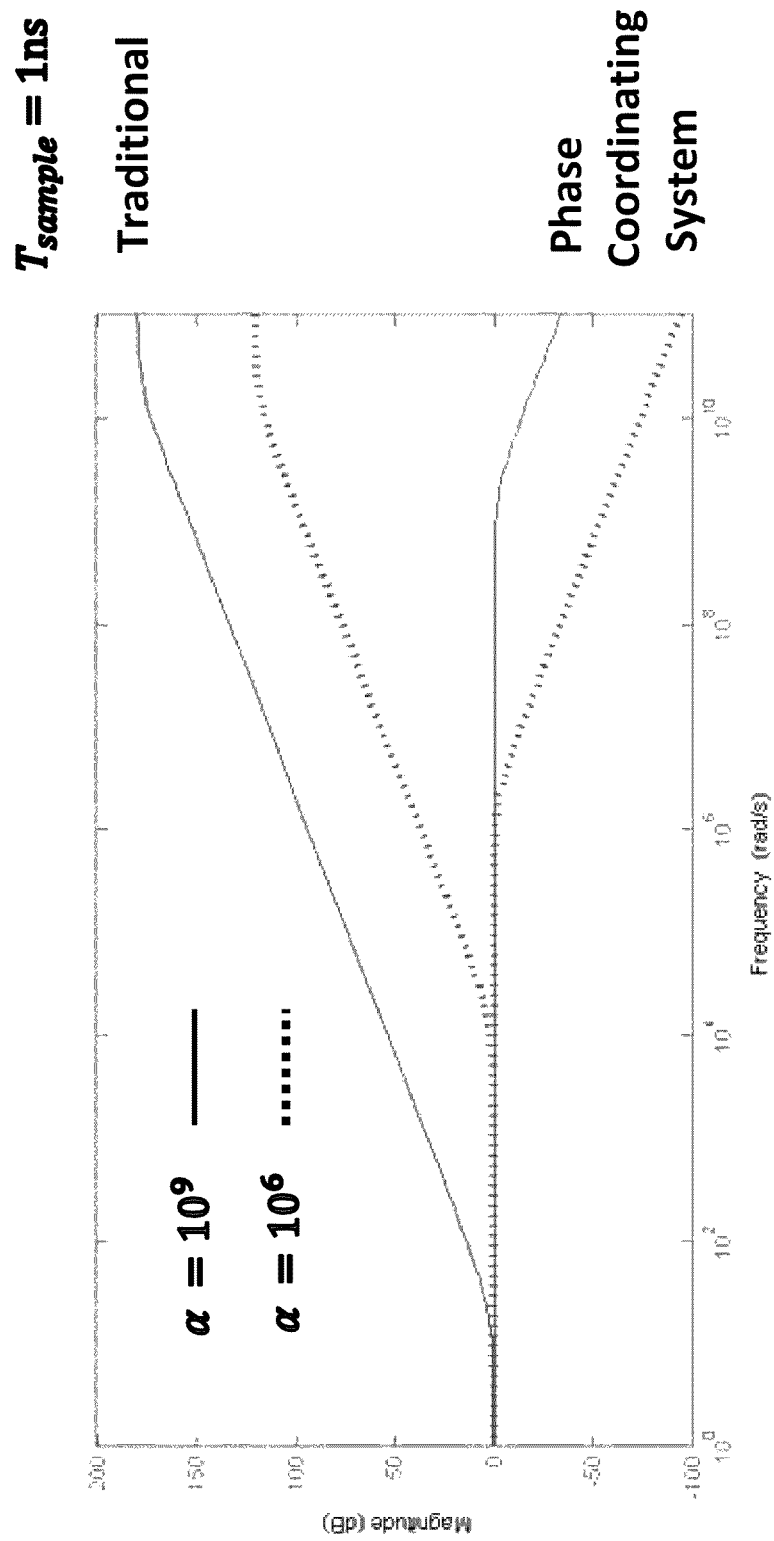

FIG. 9(a)-(c) show example output data of an actual phase coordinating system. FIG. 9(a) is example output of a phase locator simulation. In this example, it can be seen that the phase locator duty cycle skews less than 50% (decreasing proportionally to lower value when integrated) for the case of faster coordinating frequency. It can also be seen that the phase locator duty cycle skews greater than 50% (increasing proportionally to higher value when integrated) for case of slower coordinating frequency. Accordingly, the phase locator eliminates frequency aliasing in coordinating loop.

FIG. 9(b) is example output data of an actual phase coordinating system. It can be seen in this example that the phase locator locks to the correct frequency. Elimination of frequency aliasing is verified, as the phase coordinating system converged to the correct frequency after starting from zero Hertz.

FIG. 9(c) is a plot of a jitter transfer function for both traditional phase coordinating, and the phase coordinating system disclosed herein. It can be seen in this example that the higher the loop gain (alpha), the more accurate the phase coordinating became. In general at the highest loop gain and most optimal sample period for traditional phase coordinating, the phase coordinating system described herein exhibited more than about 100 times faster coordinating bandwidth.

In some embodiments of the phase coordinating system, components of the system, including but not limited to, the phase locator, may be implemented as all software, all hardware or combinations of these.

Figure 10:
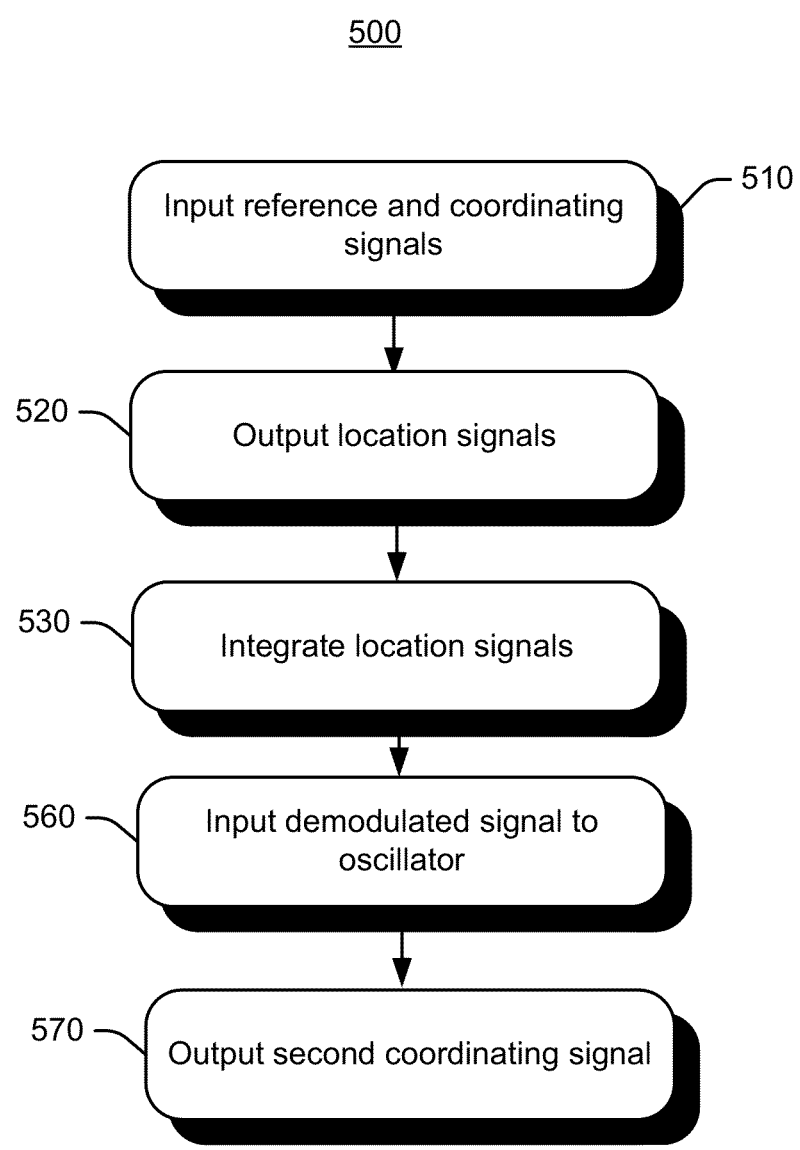
FIG. 10 is a flow diagram illustrating example operations for a fast phase coordinating system.

FIG. 10 is a flow diagram illustrating example operations 500 for a fast phase coordinating system. In an example, operation 510 includes inputting a reference signal having first reference phases and a coordinating signal having first coordinating phases to a phase locator. Operation 520 includes outputting high and low signals, identifying the location phase, the first coordinating phase relative to each first reference phase. Operation 530 includes positively integrating from the location phase to the last or time-shifted reference phase, and negatively integrating from the first reference phase to the location phase. Operation 550 includes inputting the loop control or demodulation signal to an oscillator. Operation 560 includes outputting a coordinating signal having an adjusted coordinating phase from the previous loop phase location and amplification from the oscillator.

The operations shown and described herein are provided to illustrate example implementations. It is noted that the operations are not limited to the ordering shown. Still other operations may also be implemented.

By way of example, and not intended to be limiting, the operation of outputting a second coordinating signal from the oscillator may further include outputting a second coordinating signal having a second coordinating phase different from the location phase according to the location low and location high signals.

The operation of outputting a second coordinating signal having a second coordinating phase different from the location phase according to the location low and location high signals may further include outputting a second coordinating signal having a second coordinating phase longer than the location phase when the control signal is positive and outputting a second coordinating signal having a second coordinating phase shorter than the location phase when the control signal is negative.

It is also noted that the difference between the location phase and the second coordinating phase is proportional to the control signal.

In still further operations, inputting a first reference signal having a first reference phase and a first coordinating signal having a location phase to a phase locator and outputting location high and location low signals may include detecting the first reference phase, detecting the first coordinating phase following the first reference phase, and detecting a second phase of the reference signal.

In other operations, outputting location high and location low signals may include outputting the location high signal after detecting the first phase of the first reference signal and before detecting the first phase of the coordinating signal following the first phase of the reference signal, and outputting the location low signal after detecting the first phase of the coordinating signal following the first phase of the reference signal.

Fast phase coordinating systems and methods described herein may reduce or altogether eliminate jitter peaking, enabling much higher coordinating bandwidths than have been achieved by traditional PLLs, and thus may have application in components where much higher communication bandwidths and other performance enhancements (e.g., spread spectrum clocking) are desirable. Application of a higher loop gain may also assist the loop to maintain a low-valued jitter transfer function at high frequencies. For example, the phase coordinating systems and methods described herein have been tested at approximately $10^8$ times the coordinating bandwidth of known PLL systems.

It is noted that the examples shown and described are provided for purposes of illustration and are not intended to be limiting. Still other examples are also contemplated.

The invention claimed is:

1. A fast phase coordinating system, comprising:
   a phase locator configured to detect a first phase of a reference signal and a first phase of a coordinating signal after the first phase of the reference signal;
   an integrator configured to integrate from the first phase of the reference signal to a location phase of the coordinating signal and integrate oppositely from the location phase of the coordinating signal to a time-shifted phase of the reference signal and output the result; and
   a control function configured to shift the phase of the coordinating signal in response to output from the integrator.

2. The fast phase coordinating system as set forth in claim 1, wherein the control system is continuous-time.

3. The fast phase coordinating system as set forth in claim 1, wherein the control function is configured to shift the phase of the coordinating signal with high gain.

4. The fast phase coordinating system as set forth in claim 1, wherein the system is configured to eliminate jitter-peaking while maintaining a high coordinating bandwidth while eliminating frequency abasing.

5. The fast phase coordinating system as set forth in claim 1, wherein the integrator is configured to negatively integrate from the first phase of the reference signal to the first phase of the coordinating signal and positively integrate from the first phase of the coordinating signal to the time-shifted phase of the reference signal.

6. The fast phase coordinating system as set forth in claim 5, wherein the control function is further configured to shift the phase of the coordinating signal further from the first reference phase when output from the integrator is negative and shift the phase of the coordinating signal closer to the first reference phase when output from the integrator is positive.

7. The fast phase coordinating system of claim 1, wherein the phase locator comprises a first output state between the first phase of the reference signal and the first phase of the coordinating signal and a second output state between the first phase of the coordinating signal and the time-shifted phase of the reference signal.

8. The fast phase coordinating system of claim 6, wherein the phase locator comprises first and second internal states while in the first output state and third and fourth internal states while in the second output state.

9. The fast phase coordinating system of claim 1, wherein the phase locator provides a first input with a location low signal after detecting a first reference high signal, the phase locator provides a second input a first coordinating high signal after the first reference high signal, and the phase locator provides a location high signal upon detection of a second coordinating high signal provided to the second input.

10. The fast phase coordinating system of claim 1, wherein the phase locator comprises logic gates to achieve first, second, third and fourth states.

11. The fast phase coordinating system of claim 10, wherein the logic gates output a low location signal and achieve the first state after detection of a first reference high signal at the first input.

12. The fast phase coordinating system of claim 10, wherein the logic gates output a low location signal and achieve the second state after detection of a first reference high signal at the first input and after either one or more reference low transitions or one coordinating low transition.

13. The fast phase coordinating system of claim 10, wherein the logic gates output a location high signal and achieve the third state after detection of a first reference high signal at the first input and a second coordinating high signal at the second input.

14. The fast phase coordinating system of claim 11, wherein the logic gates output a high location signal and achieve the fourth state after detection of a first reference high signal at the first input and a second coordinating high signal at the second input and after either one or more reference low transitions or one coordinating low transition.

15. A fast phase coordinating system, comprising:
   a phase locator to detect a first phase of a reference signal and a first phase of a coordinating signal after the first phase of the reference signal; and
   an integrator to integrate from the first phase of the reference signal to a location phase of the coordinating signal and integrate oppositely from the location phase of the coordinating signal to a time-shifted phase of the reference signal and output the result, wherein bandwidth of the coordinating signal approaches a frequency of the reference signal while eliminating jitter-peaking.

16. A fast phase coordinating system, comprising:
- a phase locator to detect a first phase of a reference signal and a first phase of a coordinating signal after the first phase of the reference signal;
- an integrator to integrate from the first phase of the reference signal to a location phase of the coordinating signal and integrate oppositely from the location phase of the coordinating signal to a time-shifted phase of the reference signal and output the result; and
- a control function configured to shift the phase of the coordinating signal in response to output from the integrator, wherein bandwidth of the coordinating signal approaches a frequency of the reference signal while eliminating jitter-peaking.

* * * * *